United States Patent [19]
Opris et al.

[11] Patent Number: 6,060,912
[45] Date of Patent: May 9, 2000

[54] HIGH SPEED STROBED COMPARATOR CIRCUIT HAVING A LATCH CIRCUIT

[75] Inventors: Ion E. Opris; Laurence D. Lewicki, both of Sunnyvale, Calif.

[73] Assignee: National Semiconductor Corporation, Santa Clara, Calif.

[21] Appl. No.: 08/933,781

[22] Filed: Sep. 19, 1997

[51] Int. Cl.$^7$ .............................. G11C 7/06; H03K 3/356
[52] U.S. Cl. ................................ 327/57; 327/55; 327/65; 327/215
[58] Field of Search ................................... 327/52–57, 65, 327/66, 67, 77, 87, 89, 202, 203, 199, 198, 208, 212, 215

[56] References Cited

U.S. PATENT DOCUMENTS

| | | | |
|---|---|---|---|
| 4,083,043 | 4/1978 | Breuer ...................................... | 340/347 |
| 4,408,133 | 10/1983 | Cooperman et al. ...................... | 327/89 |
| 4,965,468 | 10/1990 | Nicollini et al. ........................... | 327/89 |
| 5,012,246 | 4/1991 | Chung et al. ............................. | 341/160 |
| 5,272,395 | 12/1993 | Vincelette ................................. | 307/355 |
| 5,528,178 | 6/1996 | Pelella ...................................... | 327/55 |
| 5,537,066 | 7/1996 | Kawashima ............................... | 327/55 |

OTHER PUBLICATIONS

Behzad Razavi and Bruce A. Wooley, "Design Techniques for High–Speed, High–Resolution Comparators", IEEE Journal of Solid–State Circuits, vol. 27, No. 12, Dec. 1992, pp. 1916–1926.

H.L. Fiedler and B. Hoefflinger, "A CMOS Pulse Density Modulator for High–Resolution A/D Converters", IEEE Journal of Solid–State Circuits, vol. SC–19, No. 6, Dec. 1984, pp. 995–996.

*Primary Examiner*—Toan Tran
*Attorney, Agent, or Firm*—Limbach & Limbach L.L.P.

[57] ABSTRACT

A strobed comparator circuit with reduced signal propagation time has a regenerative latch in which, during the reset phase of operation, its output nodes are discharged to a common potential which is close to the regenerative voltage level of the cross-coupled transistors forming such regenerative latch rather than to circuit ground. Accordingly, overall signal propagation time is reduced by the amount of reduction in charging time necessary for one of the discharged nodes to recharge above the threshold voltage of one of the cross-coupled latch transistors. Also included is an output monitoring circuit which determines whether the regenerative latch has remained in a metastable state.

26 Claims, 4 Drawing Sheets

HIGH SPEED STROBED COMPARATOR CIRCUIT HAVING A LATCH CIRCUIT

BACKGROUND OF THE INVENTION

1. Field of the Invention

The present invention relates to strobed comparator circuits, and in particular, to strobed comparator circuits using regenerative latches.

2. Description of the Related Art

The processing stage of a pipelined analog-to-digital (A/D) converter includes a coarse A/D converter, a digital-to-analog (D/A) converter and a subtractor/gain circuit for calculating the residue to be passed on to the subsequent pipeline stage. The D/A converter and subtractor/gain stages are typically combined into the same switched capacitor circuit. During the sampling phase, the analog value is acquired by the current processing stage. During the hold phase the D/A and subtraction/gain operations are performed. Following the sampling phase and prior to the hold phase a comparison phase occurs since the D/A conversion depends upon the result of such comparison. This comparison is performed by a comparator circuit. Due to the reciprocal nature of the operations of successive stages within the A/D pipeline, the propagation time of the comparator function is effectively subtracted from the time allowed for the hold phase. Hence, in high speed circuits it is important to minimize the comparator propagation time so as to maximize the settling time available during the hold phase of operation.

All signal comparators have a propagation delay which is dependent upon the magnitude of the input signal (e.g., lower delay for a higher magnitude input signal). However, in a pipeline A/D application, a fixed and relatively large delay is associated with the comparison phase so as to allow for the worst case situation of the lowest possible input signal.

Additionally, high speed comparators often suffer from metastability. A metastable state occurs in strobed comparators when the inputs to the comparator are very close to the threshold value. Such metastability cannot be completely avoided. However, some techniques have been developed for reducing the probability of the occurrence of such metastability. One conventional technique involves the use of cascade latching. However, cascade latching cannot be used for high speed pipelined A/D converters due to the large comparator propagation time which degrades the high speed performance caused by a reduced settling time.

Accordingly, it would be desirable to have a high speed strobed comparator which further maximizes the available settling time and further minimizes the probability of problems due to metastability.

SUMMARY OF THE INVENTION

A high speed strobed comparator circuit in accordance with the present invention provides a reliable circuit design technique for further reducing comparator propagation time and thereby increasing the available settling time. Such a comparator circuit further reduces errors associated with metastability by allowing a small fixed delay for the comparator to reach a stable state. If metastability occurs, the comparison function is terminated and the previous comparison result is preserved.

In accordance with one embodiment of the present invention, a strobed comparator circuit with reduced signal propagation time includes first and second bias nodes, a regenerative latch circuit and a reset control circuit. The first and second bias nodes are configured to receive first and second bias voltage potentials. The regenerative latch circuit is coupled between the first and second bias nodes and includes: an associated regenerative voltage level between the first and second bias voltage potentials; a reset state with an associated reset voltage level which is between the regenerative voltage level and the second bias voltage potential and which is closer to the regenerative voltage level than to the second bias voltage potential; and an active state in which the regenerative latch circuit is configured to receive a differential analog signal which includes first and second analog signal phases and in accordance therewith provide a differential digital signal which is latched when one of the first and second analog signal phases transcends the regenerative voltage level. The reset control circuit is coupled to the regenerative latch circuit and is configured to receive a reset activation signal and in accordance therewith force the regenerative latch circuit into the reset state. The regenerative latch circuit and the reset control circuit together conduct a substantially constant current via the first and second bias nodes during the reset and active states of the regenerative latch circuit.

In accordance with another embodiment of the present invention, a strobed comparator circuit for generating a synchronous digital signal corresponding to a difference between first and second analog signals includes first and second bias nodes, a regenerative latch circuit and a reset circuit. The first and second bias nodes are configured to receive first and second bias voltage potentials. The regenerative latch circuit is coupled between the first and second bias nodes and is configured to: receive first and second reset signals and in accordance therewith provide a differential output voltage signal with first and second output voltage signal phases having first and second reset voltage values which, during an asserted state of the first and second reset signals, are both substantially equal to a reset voltage potential between the first and second bias voltage potentials; and receive and compare first and second analog current signals and in accordance therewith provide the differential output voltage signal which, during a non-asserted state of the first and second reset signals, identifies which one of the first and second analog current signals has a larger magnitude. The reset circuit is coupled to the regenerative latch circuit and is configured to receive an activation signal and in accordance therewith provide the first and second reset signals and, during the asserted state of the first and second reset signals, receive and conduct the first and second analog current signals and establish the reset voltage potential.

These and other features and advantages of the present invention will be understood upon consideration of the following detailed description of the invention and the accompanying drawings.

DETAILED DESCRIPTION OF THE INVENTION

Figure 1:
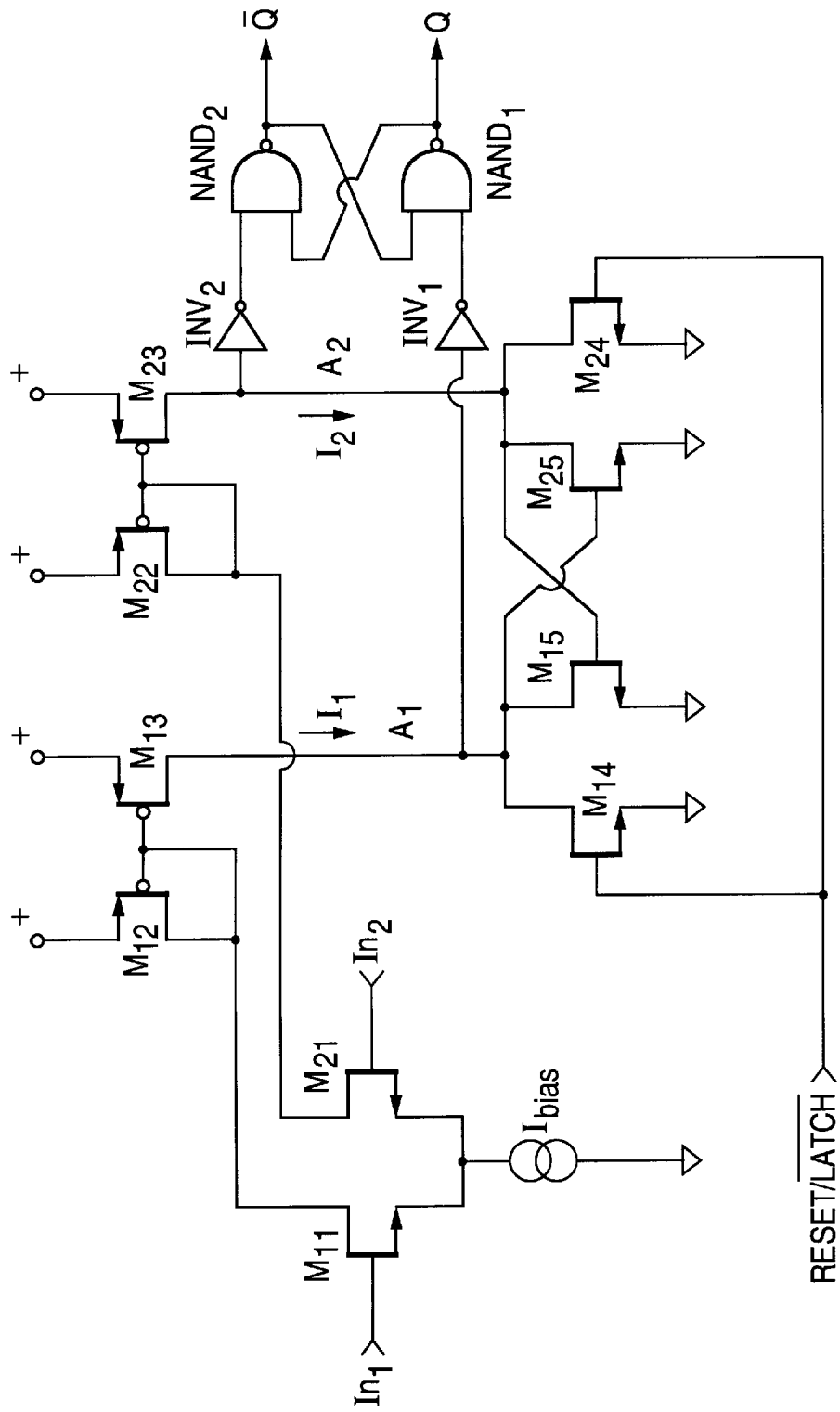
FIG. 1 is a schematic diagram of a conventional strobed comparator circuit using a regenerative latch.

Referring to FIG. 1, high speed strobed comparators often use regenerative latches which offer a number of advantages, such as high gain due to positive feedback, low power dissipation, and small integrated circuit area requirements. The differential voltage input $IN_1/IN_2$ is connected to the NMOS differential amplifier $M_{11}/M_{21}$ which is biased by a current supply $I_{bias}$. The drain currents of transistors $M_{11}$ and $M_{21}$ are replicated by two PMOS current mirror circuits $M_{12}/M_{13}$, $M_{22}/M_{23}$. With good matching of the transistors $M_{11}$, $M_{21}$, $M_{12}$, $M_{13}$, $M_{22}$, $M_{23}$, the larger of the two replicated currents $I_1$, $I_2$ will correspond to the larger of the two input voltages $IN_1$, $IN_2$.

During the reset phase (i.e., when the reset/latch signal RESET/$\overline{LATCH}$ is high), NMOS transistors $M_{14}$ and $M_{24}$ are turned on, thereby discharging nodes $A_1$ and $A_2$ to circuit ground potential. The comparison, or latching, phase starts at the falling edge of the reset/latch signal RESET/$\overline{LATCH}$, whereupon transistors $M_{14}$ and $M_{24}$ are turned off and the replicated currents $I_1$, $I_2$ gradually increase the potentials at nodes $A_1$ and $A_2$ at rates which are proportional to the respective values of such currents $I_1$, $I_2$ (e.g., at equal rates assuming substantially equal node capacitances at nodes $A_1$ and $A_2$).

Once the potential at one of the nodes $A_1$, $A_2$ reaches the threshold value of its associated latch transistor (NMOS transistor $M_{25}$ for node $A_1$ and NMOS transistor $M_{15}$ for node $A_2$), the regenerative action takes place. For example, if the first current $I_1$ is greater than the second current $I_2$, the potential at node $A_1$ reaches the NMOS transistor threshold voltage first, and, therefore, transistor $M_{25}$ is gradually turned on, thereby reducing the rate at which the potential at node $A_2$ continues to increase. Once transistor $M_{25}$ is fully turned on, node $A_2$ is discharged back to circuit ground potential, thereby turning transistor $M_{15}$ completely off. Accordingly, the latch condition is with node $A_1$ at a high potential and node $A_2$ at a low potential at least until the next rising edge of the reset/latch signal RESET/$\overline{LATCH}$.

For many applications, the output of the comparator circuit needs to be held valid for an entire clock cycle, i.e., one full cycle of the reset/latch signal RESET/$\overline{LATCH}$. Therefore, an output latch formed by two inverters $INV_1$, $INV_2$ and two cross-coupled NAND gates $NAND_1$, $NAND_2$ is used. In addition to latching and maintaining the output of the regenerative latch circuit, this output latch also buffers the sensitive internal nodes $A_1$, $A_2$ from the output nodes providing the latched output signals Q, $\overline{Q}$.

Figure 2:
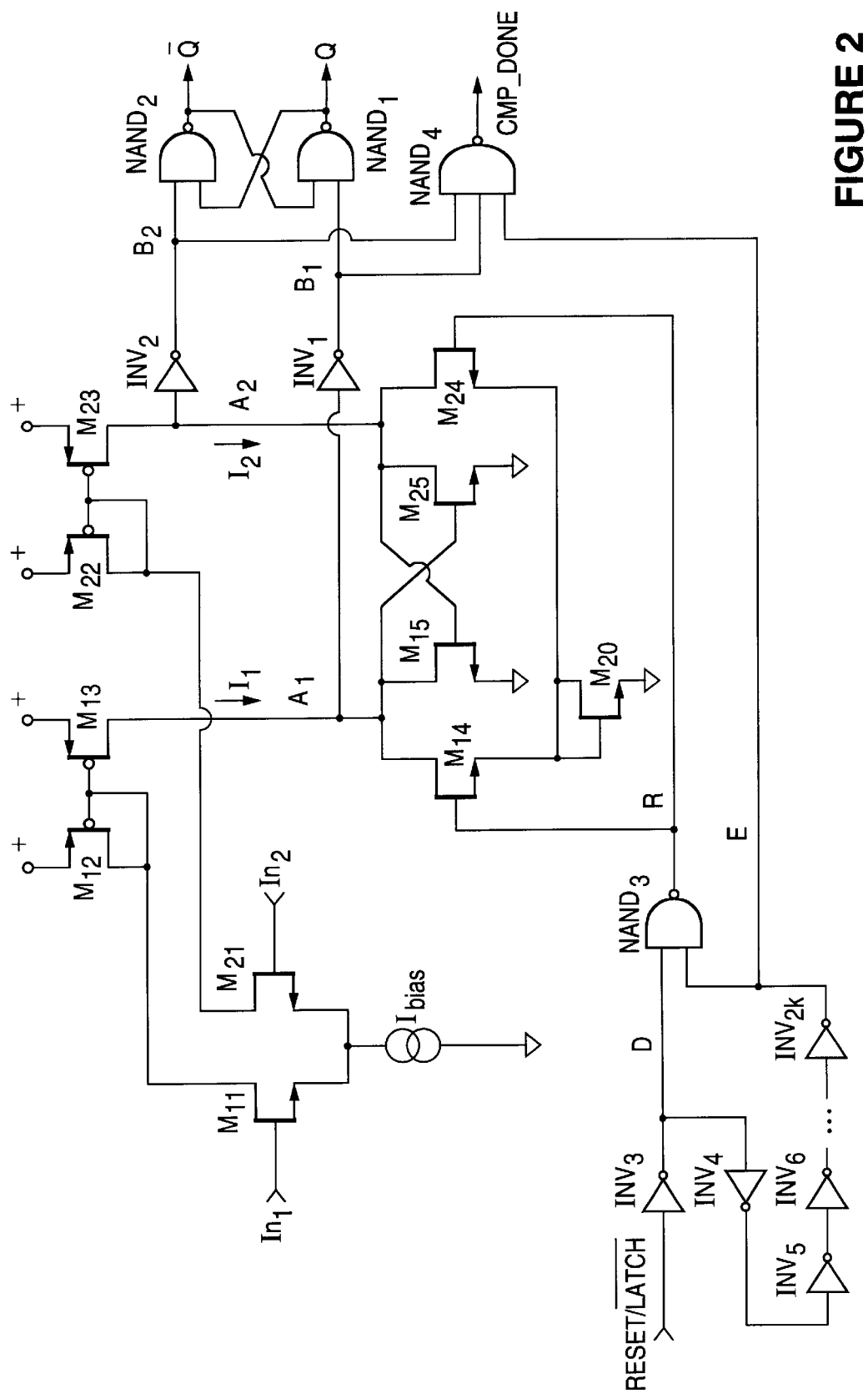
FIG. 2 is a schematic diagram of a strobed comparator circuit using a regenerative latch circuit in accordance with one embodiment of the present invention.

Referring to FIG. 2, a high speed comparator circuit with a regenerative latch circuit in accordance with one embodiment of the present invention includes some additional devices and/or circuitry for reducing the propagation delay and minimizing errors due to metastability. For example, an additional NMOS transistor $M_{20}$ is connected between the source terminals of transistors $M_{14}$ and $M_{24}$ and circuit ground. During the reset phase, i.e., when the reset/latch signal RESET/$\overline{LATCH}$ is high, nodes $A_1$ and $A_2$ are no longer discharged to circuit ground, but instead are discharged to a common potential which is close to the regenerative level of the cross-coupled transistors $M_{15}$, $M_{25}$. Accordingly, the propagation time is reduced since the delay in charging up the nodes $A_1$, $A_2$ above the NMOS transistor threshold is reduced. The regenerative level for the cross-coupled NMOS transistors $M_{15}$, $M_{25}$ can be calculated in accordance with the following:

$$V_{reg} = V_{th} + \sqrt{\frac{I_{bias}}{K \cdot \left(\frac{W}{L}\right)_{15,25}}} \quad (1)$$

where $V_{th}$ is the threshold voltage and $(W/L)_{15,\ 25}$ is the geometric aspect ratio of the transistors $M_{15}$, $M_{25}$, and K is the process constant which includes the electron mobility in the channel and oxide unit capacitance.

Equation (1) is valid for the circuits of FIGS. 1 and 2. However, for the circuit of FIG. 2, the common voltage of nodes $A_1$ and $A_2$ during the reset phase, neglecting the relatively small ON resistances of transistors $M_{14}$ and $M_{24}$ (approximately linear with large gate-to-source overdrive voltages), can be computed in accordance with the following:

$$V_{reset} = V_{th} + \sqrt{\frac{I_{bias}}{K \cdot \left[\left(\frac{W}{L}\right)_{15,25} + \frac{1}{2} \cdot \left(\frac{W}{L}\right)_{20}\right]}} \quad (2)$$

Based upon the foregoing, it can be seen that the difference between the regenerative level (equation 1) and the reset level (equation 2) has been substantially reduced without requiring the use of an additional cross-coupled pair of PMOS transistors. This is particularly advantageous since such an additional cross-coupled pair of transistors would generate substantial discharge currents, along with their associated switching noise. Furthermore, by maintaining current flow (of currents $I_1$ and $I_2$ via the alternate current paths provided by reset transistors $M_{14}$, $M_{24}$ and $M_{20}$) rather than terminating such current flow, the circuit of FIG. 2 maintains a substantially constant draw of power supply current on the part of the regenerative latch.

The inverters $INV_1$, $INV_2$ of the output latch should be designed with input threshold voltages which are slightly above the regeneration level at nodes $A_1$ and $A_2$ (equation 1). Under such a condition, during the reset phase and a metastable state, both of the intermediate output nodes $B_1$, $B_2$ are in a high logic state. This is important due to the fact that when either one of these nodes, $B_1$, $B_2$ is in a low logic state, thereby indicating that the regenerative transistor pair $M_{15}$, $M_{25}$ has been triggered, the result is stored by the output latch $NAND_1$, $NAND_2$. At the same time, the "comparison done" CMP_DONE output from the comparison circuit $NAND_4$ becomes active in a high logic state.

The circuit of FIG. 2 also includes additional circuitry to minimize errors due to metastability on the part of the regenerative latch circuit. A metastable state occurs when nodes $A_1$ and $A_2$ stay at the common regenerative level. Under this condition, the intermediate output latch nodes $B_1$ and $B_2$ are in high logic states. This condition can persist until the next rising edge of the reset signal at node R which is generated by the digital timer circuit implemented with inverters $INV_3$ through $INV_{2k}$ and NAND gate $NAND_3$. The number of inverters connected between nodes D and E is odd and the total propagation delay of such inverters determines the width of the low logic state of the signal at node R which represents the active comparison state. Accordingly, the signal at node E is an inverted and time-delayed version of the signal at node D.

Figure 3A:
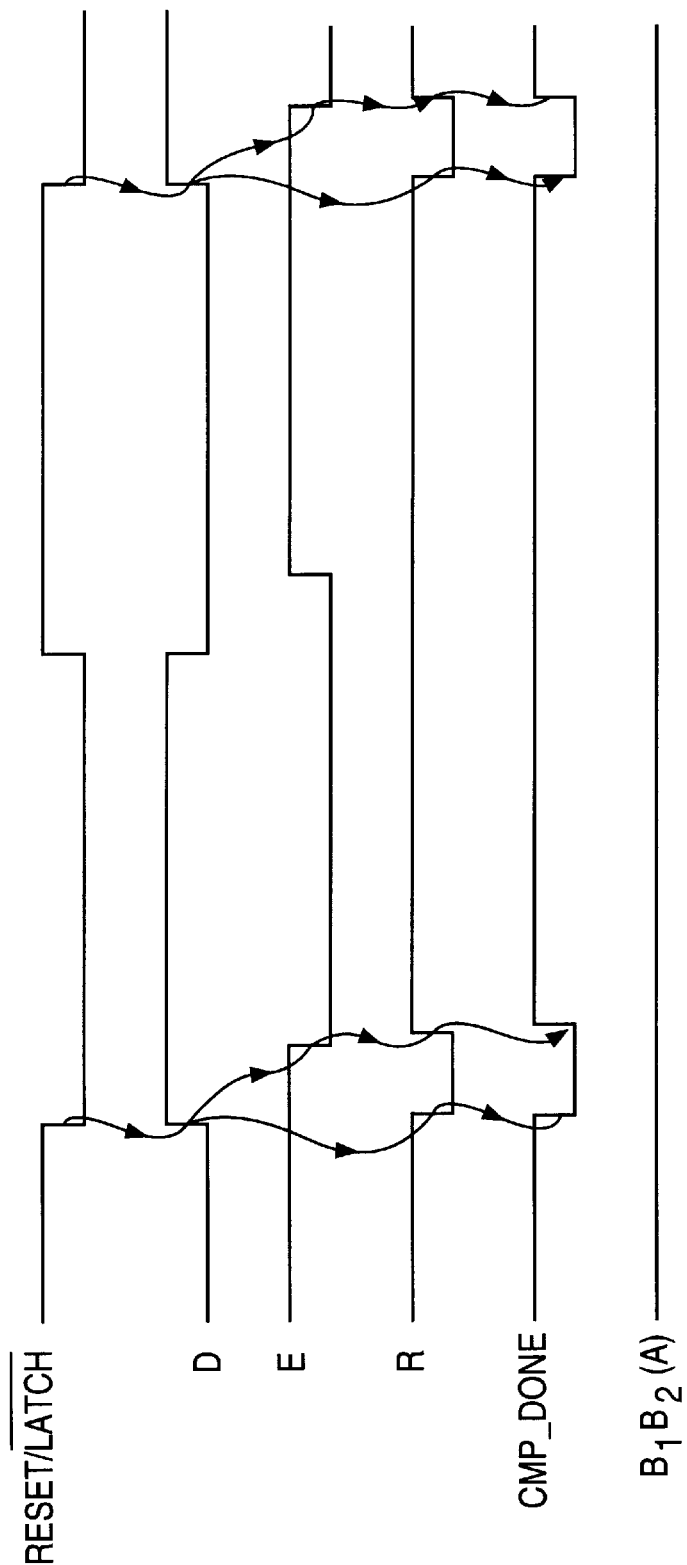
FIGS. 3A and 3B are signal timing diagrams for the circuit of FIG. 2.
Figure 3B:
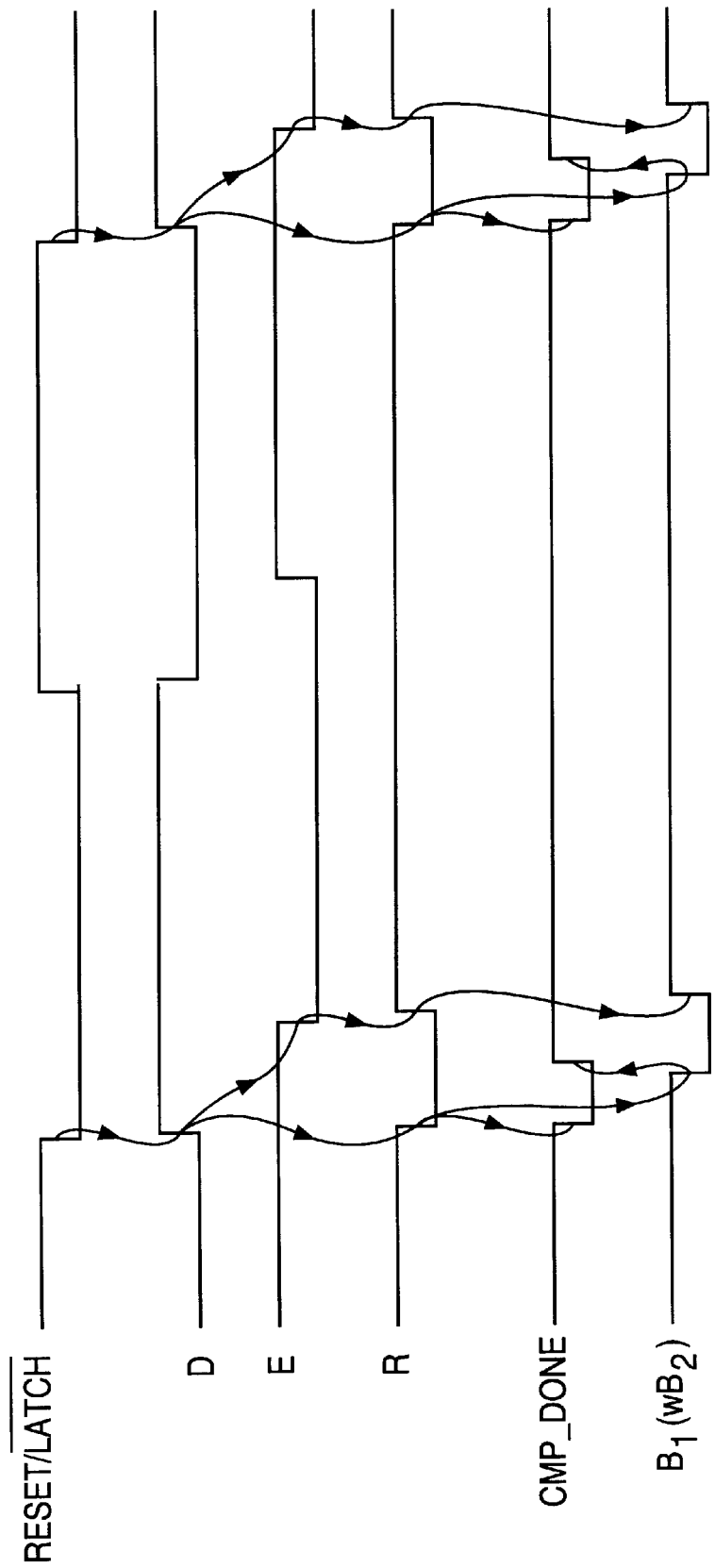

Referring to FIGS. 3A and 3B, the reset transistors $M_{14}$, $M_{24}$ are turned on at the rising edge of the signal at node R and nodes $A_1$ and $A_2$ are discharged to the common reset potential $V_{reset}$ as determined in accordance with equation 2.

The signal at node E activates the comparison done signal CMP_DONE. The resulting timing relationships among the signals are as represented in FIG. 3A for maximum delay conditions, i.e., where intermediate output latch nodes $B_1$ and $B_2$ both stay in high logic states, and in FIG. 3B for the normal condition where one of the intermediate nodes $B_1$, $B_2$ goes to a low logic state during the comparison phase of operation. Hence, the timing relationships of FIG. 3A correspond to periods of metastable conditions, while the timing relationships of FIG. 3B correspond to periods of stable conditions.

Based upon the foregoing, it can be seen that improved, i.e., reduced, propagation delay is achieved without causing large transients in the values of supply current drawn from the power supply, thereby minimizing switching noise. Further, to optimize the trade-off between settling time and propagation delay an additional output signal is provided to indicate the completion of the comparison phase and to initiate the hold phase. Further still, problems associated with metastability are minimized by allowing only a small fixed maximum delay for the comparator circuit to reach its stable state. If, by the end of such delay period, a metastable state exists, the present comparison result is discarded and the previous comparison result is preserved until such time as another comparison has taken place and a stable state has been achieved.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a strobed latch circuit with reduced signal propagation time, comprising:
   first and second bias nodes configured to receive first and second bias voltage potentials;
   a regenerative latch circuit, coupled between said first and second bias nodes, which includes
      an associated regenerative voltage level between said first and second bias voltage potentials,
      a reset state with an associated reset voltage level which is between said regenerative voltage level and said second bias voltage potential and which is closer to said regenerative voltage level than to said second bias voltage potential, and
      an active state in which said regenerative latch circuit is configured to receive a differential analog signal which includes first and second analog signal phases and in accordance therewith provide a differential digital signal which is latched when one of said first and second analog signal phases transcends said regenerative voltage level; and
   a reset control circuit, coupled to said regenerative latch circuit and said first and second bias nodes, configured to receive a reset activation signal and in accordance therewith force said regenerative latch circuit into said reset state;
   wherein said regenerative latch circuit and said reset control circuit together conduct a substantially constant current via said first and second bias nodes during said reset and active states of said regenerative latch circuit.

2. The apparatus of claim 1, wherein said regenerative latch circuit comprises a plurality of cross-coupled transistors.

3. The apparatus of claim 1, wherein said reset control circuit comprises:
   first and second current shunting circuits configured to conduct first and second currents, respectively, together as said substantially constant current during said reset state of said regenerative latch circuit; and
   a current sinking circuit, coupled to said first and second current shunting circuits, configured to receive and conduct said first and second currents together during said reset state of said regenerative latch circuit.

4. The apparatus of claim 1, further comprising:
   an output latch circuit, coupled to said regenerative latch circuit, configured to receive and latch said differential digital signal; and
   a test circuit, coupled to said regenerative latch circuit, configured to receive said differential digital signal and a test signal and in accordance therewith identify when at least one of a phase of said differential digital signal and said test signal has transcended a predetermined voltage potential.

5. The apparatus of claim 4, wherein said output latch circuit comprises a plurality of cross-coupled logic gates.

6. The apparatus of claim 4, wherein said test circuit comprises a logic gate.

7. The apparatus of claim 4, further comprising a control signal generator circuit, coupled to said reset control circuit and said test circuit, configured to receive a control signal and in accordance therewith provide said reset activation signal and said test signal.

8. The apparatus of claim 1, further comprising a plurality of current sourcing circuits, coupled to said regenerative latch circuit, configured to provide first and second currents which together form said substantially constant current as said differential analog signal.

9. The apparatus of claim 1, further comprising a differential current source circuit, coupled to said regenerative latch circuit, configured to receive a differential input signal and in accordance therewith provide a differential current signal as said substantially constant current which forms said differential analog signal.

10. An apparatus including a strobed latch circuit for generating a synchronous digital signal corresponding to a difference between first and second analog signals, said strobed latch circuit comprising:
   first and second bias nodes configured to receive first and second bias voltage potentials;
   a regenerative latch circuit coupled between said first and second bias nodes and configured to
      receive first and second reset signals and in accordance therewith provide a differential output voltage signal with first and second output voltage signal phases having first and second reset voltage values which, during an asserted state of said first and second reset signals, are both substantially equal to a reset voltage potential between said first and second bias voltage potentials, and
      receive and compare first and second analog current signals and in accordance therewith provide said differential output voltage signal which, during a non-asserted state of said first and second reset signals, identifies which one of said first and second analog current signals has a larger magnitude; and
   a reset circuit, coupled to said regenerative latch circuit, configured to receive an activation signal and in accordance therewith provide said first and second reset signals and, during said asserted state of said first and second reset signals, receive and conduct said first and second analog current signals and establish said reset voltage potential.

11. The apparatus of claim 10, wherein said regenerative latch circuit comprises a plurality of cross-coupled transistors.

12. The apparatus of claim 10, wherein said reset circuit comprises:

first and second current shunting circuits configured to receive said activation signal and in accordance therewith provide said first and second reset signals and, during said asserted state of said first and second reset signals, receive and conduct said first and second analog current signals, respectively; and a current sinking circuit, coupled to said first and second current shunting circuits, configured to receive and conduct said first and second analog current signals together during said asserted state of said first and second reset signals and in accordance therewith establish said reset voltage potential.

13. The apparatus of claim 10, further comprising:

an output latch circuit, coupled to said regenerative latch circuit, configured to receive and latch said differential output voltage signal; and a test circuit, coupled to said regenerative latch circuit, configured to receive said differential output voltage signal and a test signal and in accordance therewith identify when at least one of said first and second output voltage signal phases and said test signal has transcended a predetermined voltage potential.

14. The apparatus of claim 13, wherein said output latch circuit comprises a plurality of cross-coupled logic gates.

15. The apparatus of claim 13, wherein said test circuit comprises a logic gate.

16. The apparatus of claim 13, further comprising a control signal generator circuit, coupled to said reset circuit and said test circuit, configured to receive a control signal and in accordance therewith provide said activation signal and said test signal.

17. The apparatus of claim 16, further comprising a plurality of current sourcing circuits, coupled to said regenerative latch circuit, configured to provide said first and second analog current signals.

18. The apparatus of claim 10, further comprising a differential current source circuit, coupled to said regenerative latch circuit, configured to receive a differential input signal and in accordance therewith provide a differential current signal as said first and second analog current signals.

19. A method of performing a strobed signal latching with reduced signal propagation time, said method comprising the steps of:

biasing a regenerative latch circuit between first and second bias voltage potentials;

setting a regenerative voltage level for said regenerative latch circuit between said first and second bias voltage potentials;

receiving a reset activation signal and in accordance therewith operating said regenerative latch circuit in a reset state by generating a reset voltage level which is between said regenerative voltage level and said second bias voltage potential and which is closer to said regenerative voltage level than to said second bias voltage potential;

operating said regenerative latch circuit in an active state by receiving a differential analog signal which includes first and second analog signal phases and in accordance therewith generating a differential digital signal which is latched when one of said first and second analog signal phases transcends said regenerative voltage level; and conducting a substantially constant current during said reset and active states of said regenerative latch circuit.

20. The method of claim 19, wherein said step of receiving a reset activation signal and in accordance therewith operating said regenerative latch circuit in a reset state by generating a reset voltage level which is between said regenerative voltage level and said second bias voltage potential and which is closer to said regenerative voltage level than to said second bias voltage potential comprises:

conducting first and second shunt currents together as said substantially constant current during said reset state of said regenerative latch circuit; and receiving and sinking said first and second shunt currents together during said reset state of said regenerative latch circuit.

21. The method of claim 19, further comprising the steps of:

receiving and latching said differential digital signal; and receiving said differential digital signal and a test signal and in accordance therewith identify when at least one of a phase of said differential digital signal and said test signal has transcended a predetermined voltage potential.

22. A method of generating a synchronous digital signal corresponding to a difference between first and second analog signals, said method comprising the steps of:

biasing a regenerative latch circuit between first and second bias voltage potentials;

receiving an activation signal and in accordance therewith generating first and second reset signals;

using said regenerative latch circuit, receiving said first and second reset signals and in accordance therewith generating a differential output voltage signal with first and second output voltage signal phases having first and second reset voltage values which, during an asserted state of said first and second reset signals, are both substantially equal to a reset voltage potential between said first and second bias voltage potentials;

using said regenerative latch circuit, receiving and comparing first and second analog current signals and in accordance therewith generating said differential output voltage signal which, during a non-asserted state of said first and second reset signals, identifies which one of said first and second analog current signals has a larger magnitude; and receiving and conducting said first and second analog current signals during said asserted state of said first and second reset signals and in accordance therewith generating said reset voltage potential.

23. The method of claim 22, wherein said step of receiving and conducting said first and second analog current signals during said asserted state of said first and second reset signals and in accordance therewith generating said reset voltage potential comprises:

conducting first and second shunt currents as said first and second analog current signals, respectively, during said asserted state of said first and second reset signals; and receiving and sinking said first and second shunt currents together during said asserted state of said first and second reset signals and in accordance therewith generating said reset voltage potential.

24. The method of claim 22, further comprising the steps of:

receiving and latching said differential output voltage signal; and receiving said differential output voltage signal and a test signal and in accordance therewith identifying when at least one of said first and second output voltage signal phases and said test signal has transcended a predetermined voltage potential.

25. An apparatus including a strobed comparator circuit with reduced signal propagation time, comprising:

first and second bias nodes configured to receive first and second bias voltage potentials;

a regenerative latch circuit, coupled between said first and second bias nodes, which includes
an associated regenerative voltage level between said first and second bias voltage potentials,
a reset state with an associated reset voltage level which is between said regenerative voltage level and said second bias voltage potential and which is closer to said regenerative voltage level than to said second bias voltage potential, and
an active state in which said regenerative latch circuit is configured to receive a differential analog signal which includes first and second analog signal phases and in accordance therewith provide a differential digital signal which is latched when one of said first and second analog signal phases transcends said regenerative voltage level;

a reset control circuit, coupled to said regenerative latch circuit and said first and second bias nodes, configured to receive a reset activation signal and in accordance therewith force said regenerative latch circuit into said reset state;

a differential amplifier circuit configured to receive a differential voltage signal and in accordance therewith provide a first differential current signal; and first and second current amplifier circuits, coupled to said differential amplifier circuit, configured to receive said first differential current signal and in accordance therewith provide a second differential current signal as said substantially constant current which forms said differential analog signal;

wherein said regenerative latch circuit and said reset control circuit together conduct a substantially constant current via said first and second bias nodes during said reset and active states of said regenerative latch circuit.

26. An apparatus including a strobed latch circuit for generating a synchronous digital signal corresponding to a difference between first and second analog signals, said strobed comparator circuit comprising:

first and second bias nodes configured to receive first and second bias voltage potentials;

a regenerative latch circuit coupled between said first and second bias nodes and configured to
receive first and second reset signals and in accordance therewith provide a differential output voltage signal with first and second output voltage signal phases having first and second reset voltage values which, during an asserted state of said first and second reset signals, are both substantially equal to a reset voltage potential between said first and second bias voltage potentials, and
receive and compare first and second analog current signals and in accordance therewith provide said differential output voltage signal which, during a non-asserted state of said first and second reset signals, identifies which one of said first and second analog current signals has a larger magnitude;

a reset circuit, coupled to said regenerative latch circuit, configured to receive an activation signal and in accordance therewith provide said first and second reset signals and, during said asserted state of said first and second reset signals, receive and conduct said first and second analog current signals and establish said reset voltage potential;

a differential amplifier circuit configured to receive a differential voltage signal and in accordance therewith provide a first differential current signal; and first and second current amplifier circuits, coupled to said differential amplifier circuit, configured to receive said first differential current signal and in accordance therewith provide a second differential current signal as said first and second analog current signals.

* * * * *